United States Patent
Seeley

(10) Patent No.: US 11,437,248 B2
(45) Date of Patent: Sep. 6, 2022

(54) TO PUMPING LINE ARRANGEMENTS

(71) Applicant: Edwards Limited, Burgess Hill (GB)

(72) Inventor: Andrew James Seeley, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 239 days.

(21) Appl. No.: 16/628,337

(22) PCT Filed: Jul. 3, 2018

(86) PCT No.: PCT/GB2018/051861
§ 371 (c)(1),
(2) Date: Jan. 3, 2020

(87) PCT Pub. No.: WO2019/008338
PCT Pub. Date: Jan. 10, 2019

(65) Prior Publication Data
US 2020/0152485 A1    May 14, 2020

(30) Foreign Application Priority Data

Jul. 6, 2017  (GB) ...................................... 1710872

(51) Int. Cl.
*H01L 21/67* (2006.01)
*C23C 16/44* (2006.01)
(Continued)

(52) U.S. Cl.
CPC .... *H01L 21/67017* (2013.01); *C23C 16/4405* (2013.01); *C23C 16/4412* (2013.01);
(Continued)

(58) Field of Classification Search
CPC ......... H01L 21/67017; H01L 21/67011; H01L 21/67155; C23C 16/4405; C23C 16/4412; F04B 41/06; F04C 19/005; F04C 25/02
See application file for complete search history.

(56) References Cited

U.S. PATENT DOCUMENTS 5,192,518 A * 3/1993 Ukawa .................. C01F 11/464
                                                        423/113
5,362,461 A * 11/1994 Ohmi ...................... C01F 11/22
                                                        423/163
(Continued)

FOREIGN PATENT DOCUMENTS

CN       101415977 A    4/2009
CN       101490422 A    7/2009
(Continued)

OTHER PUBLICATIONS

Chinese First Office Action dated May 17, 2021 for corresponding Chinese application Serial No. CN201880045121.4, 21 pages.
(Continued)

*Primary Examiner* — Jeffrie R Lund
(74) *Attorney, Agent, or Firm* — Theodore M. Magee; Westman, Champlin & Koehler, P.A.

(57) ABSTRACT

A pumping line arrangement includes a chamber connecting line which is fluidly connectable to a process chamber that forms part of a semiconductor fabrication tool. The pumping line arrangement also includes a valve module which is fluidly connected to the chamber connecting line. The valve module splits the chamber connecting line into respective first and second pumping lines. The first pumping line is intended to carry a first process flow and the second pumping line is intended to carry a second process flow which is incompatible with the first process flow. At least one of the first pumping line or the second pumping line includes fluidly connected therewithin a pre-abatement module that is configured to remove one or more incompatible constituents from the process flow intended to be carried by the other pumping line.

10 Claims, 2 Drawing Sheets

(51) Int. Cl.
*F04C 19/00* (2006.01)
*F04C 25/02* (2006.01)
*F04B 41/06* (2006.01)

(52) U.S. Cl.
CPC .......... *F04B 41/06* (2013.01); *F04C 19/005* (2013.01); *F04C 25/02* (2013.01); *H01L 21/67011* (2013.01); *H01L 21/67155* (2013.01)

(56) References Cited

U.S. PATENT DOCUMENTS

| | | | | |
|---|---|---|---|---|
| 5,597,540 | A * | 1/1997 | Akita | B01D 53/68 |
| | | | | 423/241 |
| 6,331,256 | B1 * | 12/2001 | Kezuka | C02F 1/5236 |
| | | | | 210/915 |
| 7,074,378 | B2 * | 7/2006 | Hart | C01B 21/0837 |
| | | | | 423/406 |
| 9,533,895 | B2 * | 1/2017 | Izawa | C02F 1/5236 |
| 2004/0026037 | A1 * | 2/2004 | Shinriki | C23C 16/45548 |
| | | | | 156/345.33 |
| 2004/0107897 | A1 | 6/2004 | Lee et al. | |
| 2004/0250765 | A1 | 12/2004 | Ishizaka et al. | |
| 2008/0134890 | A1 | 6/2008 | Lundszien et al. | |
| 2009/0017206 | A1 | 1/2009 | Clark et al. | |
| 2013/0340842 | A1 | 12/2013 | Daykin | |
| 2015/0252473 | A1 * | 9/2015 | Dickinson | H01J 37/32834 |
| | | | | 156/345.33 |
| 2015/0292083 | A1 | 10/2015 | Franken et al. | |
| 2017/0200622 | A1 * | 7/2017 | Shiokawa | H01J 37/32834 |
| 2017/0350395 | A1 * | 12/2017 | Schofield | F04C 23/003 |
| 2018/0207581 | A1 * | 7/2018 | Bailey | A62C 4/00 |
| 2019/0351369 | A1 * | 11/2019 | Catalano | B01D 53/78 |
| 2020/0047225 | A1 * | 2/2020 | Bailey | B01F 15/00344 |
| 2020/0080549 | A1 * | 3/2020 | Galtry | F04B 51/00 |
| 2020/0152485 | A1 * | 5/2020 | Seeley | H01L 21/67011 |
| 2020/0340605 | A1 * | 10/2020 | Murfitt | C23C 16/44 |

FOREIGN PATENT DOCUMENTS

| | | |
|---|---|---|
| CN | 204315539 U | 5/2015 |
| CN | 206054259 U | 3/2017 |
| CN | 106605064 A | 4/2017 |
| JP | 2006314869 A | 11/2006 |
| JP | 2009154091 A | 7/2009 |
| JP | 2010161150 A | 7/2010 |
| KR | 20070093499 A | 9/2007 |
| TW | 201400639 A | 1/2014 |
| WO | 0136706 A1 | 5/2001 |
| WO | 2007042749 A1 | 4/2007 |
| WO | 2007135513 A1 | 11/2007 |
| WO | 2013134151 A1 | 9/2013 |
| WO | 2016110694 A1 | 7/2016 |
| WO | 2016110695 A1 | 7/2016 |

OTHER PUBLICATIONS

Taiwanese Office Action and Search Report dated Jun. 9, 2021 for corresponding Taiwanese application Serial No. TW107123553, 9 pages.

British Search Report dated Nov. 23, 2017 and Examination Report dated Nov. 24, 2017 for corresponding British Application No. GB1710872.1.

PCT Notification of Transmittal of the International Search Report and the Written Opinion of the International Searching Authority, or the Declaration dated Sep. 26, 2018, PCT Search Report and Written Opinion dated Sep. 26, 2018 for corresponding PCT Application No. PCT/GB2018/051861.

Japanese Notice of Reasons for Refusal dated Feb. 2, 2022 for corresponding application Serial No. JP2020500098, 8 pages.

* cited by examiner

TO PUMPING LINE ARRANGEMENTS

CROSS-REFERENCE OF RELATED APPLICATION

This application is a Section 371 National Stage Application of international Application No. PCT/GB2018/051861, filed Jul. 3, 2018, and published as WO 2019/008338 A1 on Jan. 10, 2019, the content of which is hereby incorporated by reference in its entirety and which claims priority of British Application No. 1710872.1, filed Jul. 6, 2017.

FIELD

This invention relates to a pumping line arrangement for use in a semiconductor fabrication assembly or a vacuum pumping system.

BACKGROUND

Pumping line arrangements arise extensively within vacuum pumping systems for use in assemblies that fabricate semiconductors, e.g. silicon chips, flat panel displays, solar panels and light emitting diodes (LEDs). An assembly comprises one or more fabrication tools and each fabrication tool may have one or more chambers in which processing occurs. Processing in a chamber may require more than one processing step and each step may require a different processing gas. One or more vacuum pumping systems maintain the required processing pressures in the chamber and evacuate the process gases from the chambers. In pumping line arrangements in which it is intended to carry different, incompatible process gas flows in different, essentially dedicated pumping lines, it is desirable to ensure that the different incompatible process flows do not mix with one another in a manner whereby there is a high risk of a catastrophic reaction between the different process flows taking place.

The discussion above is merely provided for general background information and is not intended to be used as an aid in determining the scope of the claimed subject matter. The claimed subject matter is not limited to implementations that solve any or all disadvantages noted in the background.

SUMMARY

According to a first aspect of the invention there is provided a pumping line arrangement, for use in a semiconductor fabrication assembly, comprising:
- a chamber connecting line fluidly connectable to a process chamber forming part of a semiconductor fabrication tool within which at least two process steps are performed; and
- a valve module fluidly connected to the chamber connecting line, the valve module splitting the chamber connecting line into respective first and second pumping lines, the first pumping line being intended to carry a first process step exhaust flow and the second pumping line being intended to carry a second process step exhaust flow which is incompatible with the first process step exhaust flow,
- at least one of the first pumping line or the second pumping line including fluidly connected therewithin a pre-abatement module configured to remove one or more incompatible process step exhaust constituents from the process step exhaust flow intended to be carried by the other pumping line.

As described below in more detail relation to the Figures, the inclusion of a pre-abatement module, within a given pumping line, which is configured to one or more incompatible constituents from the process flow which, in use, will be carried by the other pumping line, i.e. the other process flow, allows the pumping line arrangement to, as required, neutralise any of the other process flow which may erroneously flow in the given pumping line, e.g. in the event of a mechanical or control system failure. In other words, the pre-abatement module removes one or more constituents of the other process flow which might otherwise react undesirably with the intended process flow of the given pumping line, such that any subsequent downstream mixing of the neutralised other process flow and the intended process flow will not result in a catastrophic reaction between the said process flows.

Meanwhile such a pre-abatement module has a minimal effect on the intended process flow passing through the given pumping line, such that abatement of the intended process flow can be carried out by a dedicated abatement module optimised for the given nature if the intended process flow.

Accordingly the pre-abatement module requires no external intervention in so far as under normal operating conditions it has a minimal effect on the intended process flow, while under adverse operating conditions, i.e. erroneous flow of the other process flow through the pre-abatement module, it acts to remove the or each reactive constituent from the other process flow.

Preferably the or each pre-abatement module is fluidly connected within the corresponding pumping, line immediately downstream of the valve module, Such an arrangement helps to minimise the likelihood of any un-neutralised other process flow mixing with the intended process flow, e.g. a portion of intended process flow which might linger in the given pumping line.

In a preferred embodiment of the invention the first pumping line includes fluidly connected therewithin a first pre-abatement module configured to remove one or more incompatible process step exhaust constituents from the second process flow, and wherein the second pumping line includes fluidly connected therewithin a second pre-abatement module configured to remove one or more incompatible process step exhaust constituents from the first process flow.

The inclusion of first and second pre-abatement modules provides protection, in each of the first and second pumping lines, against erroneous mixing in a reactive manner of the first and second process flows.

Optionally the first pumping line defines a deposition pumping line intended to carry a deposition process flow, the second pumping line defines a cleaning pumping line intended to carry a cleaning process flow, the first pre-abatement module is configured to remove one or more incompatible process step exhaust constituents from the cleaning process flow and the second pre-abatement module is configured to remove one or more incompatible process step exhaust constituents from the deposition process flow.

Such an arrangement is particularly suitable for use in a semiconductor fabrication assembly which routinely utilises deposition and cleaning processes.

In a vacuum pumping system, the first pumping line may include fluidly connected therewithin a first primary abatement module configured to abate the first process flow, and the second pumping line may include fluidly connected therewithin a second primary abatement module configured to abate the second process flow, and each of the primary abatement modules may be located downstream of the corresponding pre-abatement module.

The provision of a respective primary abatement module in each pumping line permits an optimisation of the abatement required within a given pumping line according to the nature of the intended process flow to be carried by the given pumping line, and so helps to improve the overall efficiency of an associated semiconductor fabrication process.

Preferably the first pre-abatement module includes a fluorine removal agent. The inclusion of such a removal agent helps to ensure that a common cleaning fluid, e.g. fluorine gas, is removed from the first pumping line in the event that it is erroneously introduced thereto.

Optionally the fluorine removal agent is or includes:
calcium carbonate; and/or
silicon.

Each of calcium carbonate and silicon advantageously reacts, particularly when warmed, e.g. at or around 300° C., with fluorine to produce relatively inert by-products, and so can thereby be used to remove fluorine from the first pumping line. Moreover, neither calcium carbonate nor silicon reacts with common deposition gases, such as silane, ammonia, or hydrogen, and so remains essentially passive while the intended process flow, i.e. a deposition process flow, passes through the first pumping line.

In another preferred embodiment of the invention the second pre-abatement module includes a fluorinating agent.

Such an agent is inert with respect to a common cleaning fluid, i.e. fluorine gas, which is likely to constitute at least a part of the intended process flow in the second pumping line. Meanwhile such an agent is reactive towards one or more common deposition gases, e.g. silane, which are likely to be a constituent of the first process flow, and so such a fluorinating agent can be used to remove such incompatible constituents from the second pumping line in the event that the first process flow is erroneously introduced thereto.

The fluorinating agent may be or include:
a transitional metal fluoride; and/or
potassium tetrafluorocobaltate.
Preferably the transitional metal fluoride is or includes:
cobalt (III) fluoride; and/or
a ferric fluoride.

Each of the aforementioned advantageously reacts with a deposition fluid, e.g. silane, to produce relatively inert by-products, and so can thereby be used to remove such a deposition fluid from the second pumping line.

In an example of a vacuum pumping system comprising such a pumping line arrangement the vacuum pumping system may comprise a first primary abatement module and a second primary abatement module and the first pumping line is fluidly connected with the first primary abatement module which is configured to abate the first process flow, and the second pumping line is fluidly connected with the second primary abatement module which is configured to abate the second process flow, each of the primary abatement modules being located downstream of the corresponding upstream pre-abatement module.

The chamber connecting lines may be fluidly connectable to respective process chambers forming; part of one or more semiconductor fabrication tools; and a first common pumping line may be in fluid connection with the first primary abatement module and the first pumping lines of the pumping line arrangements; and a second common pumping, line may be in fluid connection with the second primary abatement module and the second pumping lines of the pumping line arrangements.

The first common pumping line may be in fluid connection with a first vacuum pumping arrangement and the second common pumping line may be in fluid connection with a second vacuum pumping arrangement.

According to a further aspect of the invention there is provided a semiconductor fabrication tool comprising at least one processing chamber having a pumping line arrangement according to any preceding claim fluidly connected therewith.

The semiconductor fabrication tool of the invention shares the advantages of the corresponding features of the pumping line arrangement.

The Summary is provided to introduce a selection of concepts in a simplified form that are further described in the Detail Description. This summary is not intended to identify key features or essential features of the claimed subject matter, nor is it intended to be used as an aid in determining the scope of the claimed subject matter.

BRIEF DESCRIPTION OF THE FIGURES

There now follows a brief description of some embodiments of the invention, by way or non-limiter examples, with reference being made to the following Figures in which.

DETAILED DESCRIPTION

Figure 1:
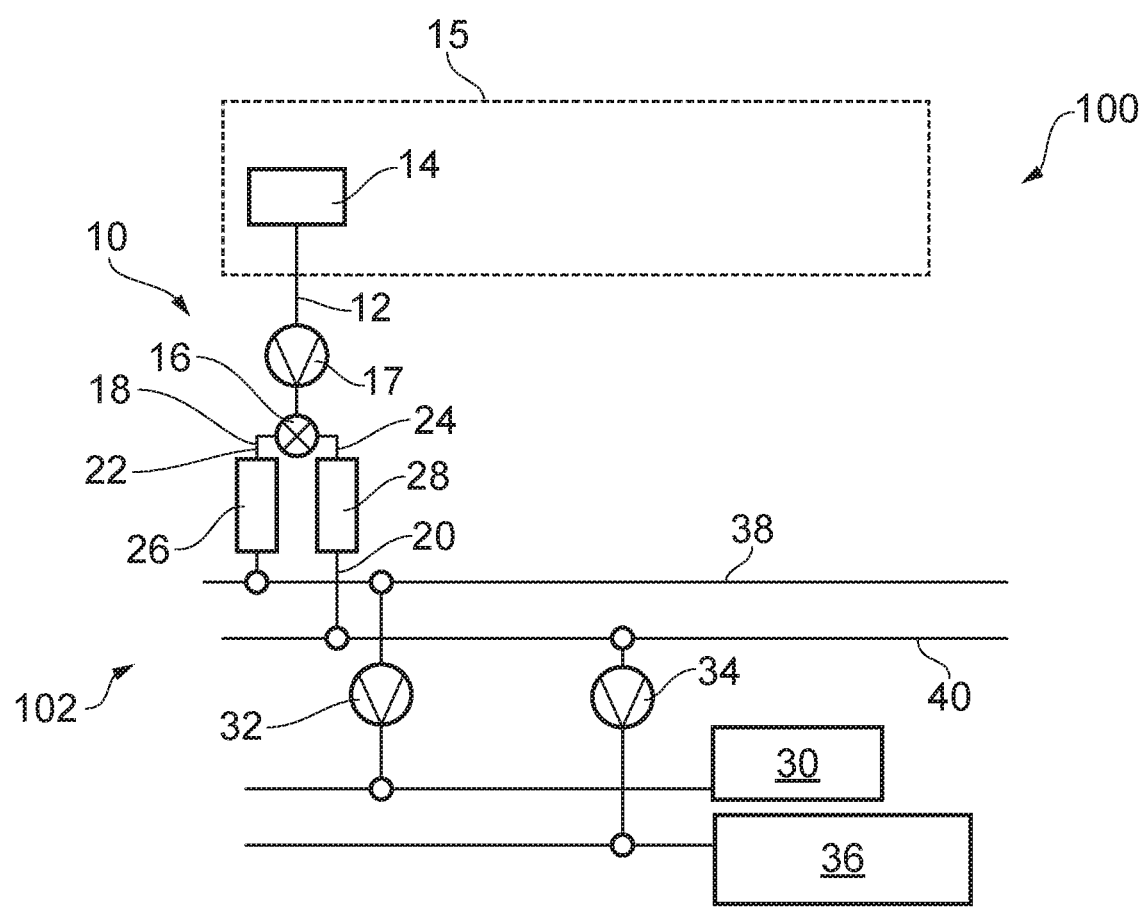
FIG. 1 shows a schematic view of a pumping line arrangement according to a first embodiment of the invention in a semiconductor fabrication assembly.

Referring to FIG. 1, a semiconductor fabrication assembly 101) is shown which comprises a semiconductor fabrication tool 15 comprising a process chamber 14 in which at least two process steps are performed. A vacuum pumping system 102 maintains a required processing pressure for each process step and exhausts a process step exhaust gas flow for each process step.

The vacuum pumping system comprises a pumping line arrangement 10 according to a first embodiment of the invention. The pumping line arrangement includes a chamber connecting line 12 which, in use, is fluidly connected to the process chamber 14.

In the embodiment shown the chamber connecting line 12 includes a booster pump 17 fluidly connected therewithin, although this need not necessarily be the case. A booster pump increases gas flow along the chamber connecting line, particularly if the vacuum pumping system is located some distance from the chamber or chambers.

In this example two process steps are performed requiring two process step exhaust gas flows and the pumping line arrangement 10 also includes a valve module 16 which is fluidly connected to the chamber connecting line 12, and which splits the chamber connecting line 12 into respective first and second pumping lines 18, 20. The valve module conveys the process step exhaust gas flows to a selected one of the first and second pumping lines as required, in this regard, the first pumping line 18 is intended to carry a first process step exhaust flow while the second pumping line is intended to carry a second process step exhaust gas flow. If in other examples more than two process steps are performed requiring more than two process step exhaust gas flows, then the pumping line arrangement would comprise at least an equivalent number of pumping lines and the valve module would be arranged to convey gas to the selected pumping line. There may additionally be a pump down pumping line for quickly evacuating a chamber.

Typically, the first process flow and the second process flow occur sequentially one after the other during fabrication in the process chamber 14. The first and second process flows are incompatible with one another to the extent that each has one or more incompatible process step exhaust gas constituents which will react, potentially catastrophically, with one or more such incompatible process step exhaust gas constituents of the other process flow.

In the illustrated example, the first pumping line 18 defines a deposition pumping line 22 which is intended to carry a deposition process flow, and the second pumping line 20 defines a cleaning pumping line 24 which is intended to carry a cleaning process flow. In the embodiment shown the deposition process flow is constituted solely of silane ($SiH_4$), but might also be or include ammonia ($NH_3$), hydrogen ($H_2$), or the like reducing species. The cleaning process flow is constituted solely of fluorine ($F_2$), although other oxidizing species, particularly other halogens, are also possible.

In addition, the first pumping line 18, i.e. the deposition pumping line 22 in this example, includes a first pre-abatement module 26 which is fluidly interconnected with the first pumping line 18. The first pre-abatement module 26 is configured to remove an incompatible constituent from the second process flow if inadvertently the second process flow is conveyed through the first pumping line, but in normal operation allows the passage of the first process flow substantially unchanged. In this example the second process flow is a cleaning process flow, and therefore the first preabatement: module may be configured to remove fluorine from the cleaning process flow. In other embodiments of the invention (not shown) the first pre-abatement module 26 may be configured to remove a different constituent of the second process flow, either as well as or instead of the fluorine mentioned above.

The second pumping line 20, i.e. the cleaning pumping line 24 in this example, includes a second pre-abatement module 28 fluidly interconnected therewith. The second pre-abatement module 28 is configured to remove an incompatible constituent from the first process flow if inadvertently be first process flow is conveyed through the second pumping line, but in normal operation allows the passage of the second process flow substantially unchanged. In this example the first process flow is a deposition process flow, and therefore the second pre-abatement module is configured to remove silane from the deposition process flow. In other embodiments of the invention (not shown) the second pre-abatement module 28 may be configured to remove a different constituent of the first process flow, either as well as or instead of the aforementioned silane.

Therefore the first and the second pre-abatement modules are passive abatement modules in that they perform abatement only if inadvertently a process step exhaust flow is conveyed along an incorrect pumping line. They do not significantly interact with or alter the process gas flows during normal operation, since during normal operation mixing of gas flows does not occur and therefore abatement is performed by primary abatement modules (described below). Further, the pre-abatement modules are not substantially degraded during normal operation and may in some examples be replenished by the correct process flows. Operation may not occur normally if there is a failure of one or more parts of the system, such as in the booster pump 17 or valve 16.

Each of the first and second pre-abatement modules 26, 28 is located immediately downstream of the valve module 16, i.e. there is no other component in the portion of pumping lines 18, 20 which lies between the respective pre-abatement module 26, 28 and the valve module 16.

The valve module 16 shown includes a three way valve, but in other embodiments may include a different valve arrangement, such as a pair of simple valves and a two-way pipeline branch.

The valve module 16 may also, optionally, include a fail-safe arrangement, e.g. a mechanical interlock or an electronic handshake, to help prevent the erroneous introduction of the second process flow into the first pumping line 18 and/or the erroneous introduction of the first process flow into the second pumping line 20.

The first pumping line 18 is arranged in fluid communication with a first primary abatement module 30 which is located downstream of the first pre-abatement module 26. Moreover, the first primary abatement module 30 may be arranged in such fluid communication with the first pumping line 18 via, e.g. a first primary pump 32, which urges the first process flow through the first pumping line 18.

The first primary abatement module 30 is configured optimally to abate the intended process flow within the first pumping line 18, i.e. the first process flow in the form of a deposition process flow. Accordingly, in the embodiment shown the first primary abatement module 30 is configured to abate silane from the deposition process flow. As such the first primary abatement module 30 may take the form of any of a plasma-based device, a flame-based device, or an oxidizer. A further primary abatement module (not shown), such as a wet scrubber, may be arranged downstream of the first primary abatement module 30 in order to abate any remaining incompatible constituents from the exhaust flow of the first primary abatement module 30.

Meanwhile the second pumping line 20 is arranged in fluid communication, e.g. via a second primary pump 34, with a second primary abatement module 36 which, again, is located downstream of the corresponding second pre-abatement module 28.

The second primary abatement module 36 is configured optimally to abate the intended process flow within the second pumping line 20, i.e. the second process flow in the form of a cleaning process flow. As such, in the embodiment shown the second primary abatement module 36 is configured to abate fluorine from the cleaning process flow, and so may take the form of a wet scrubber.

Furthermore, the first pumping line 18 is arranged in fluid communication with a first common pumping line 38 which, in use, is fluidly connected to one or more first pumping lines 18 of other similar pumping line arrangements (not shown), each of which similar pumping line arrangements is in turn fluidly connected to a further corresponding process chamber.

Similarly, the second pumping line 20 is arranged in fluid communication with a second common pumping line 40 which, in use, is fluidly connected to one or more second pumping lines 20 of other similar pumping line arrangements (not shown), each of which similar pumping line arrangements is in turn fluidly connected to the aforesaid further corresponding process chamber.

Figure 2:
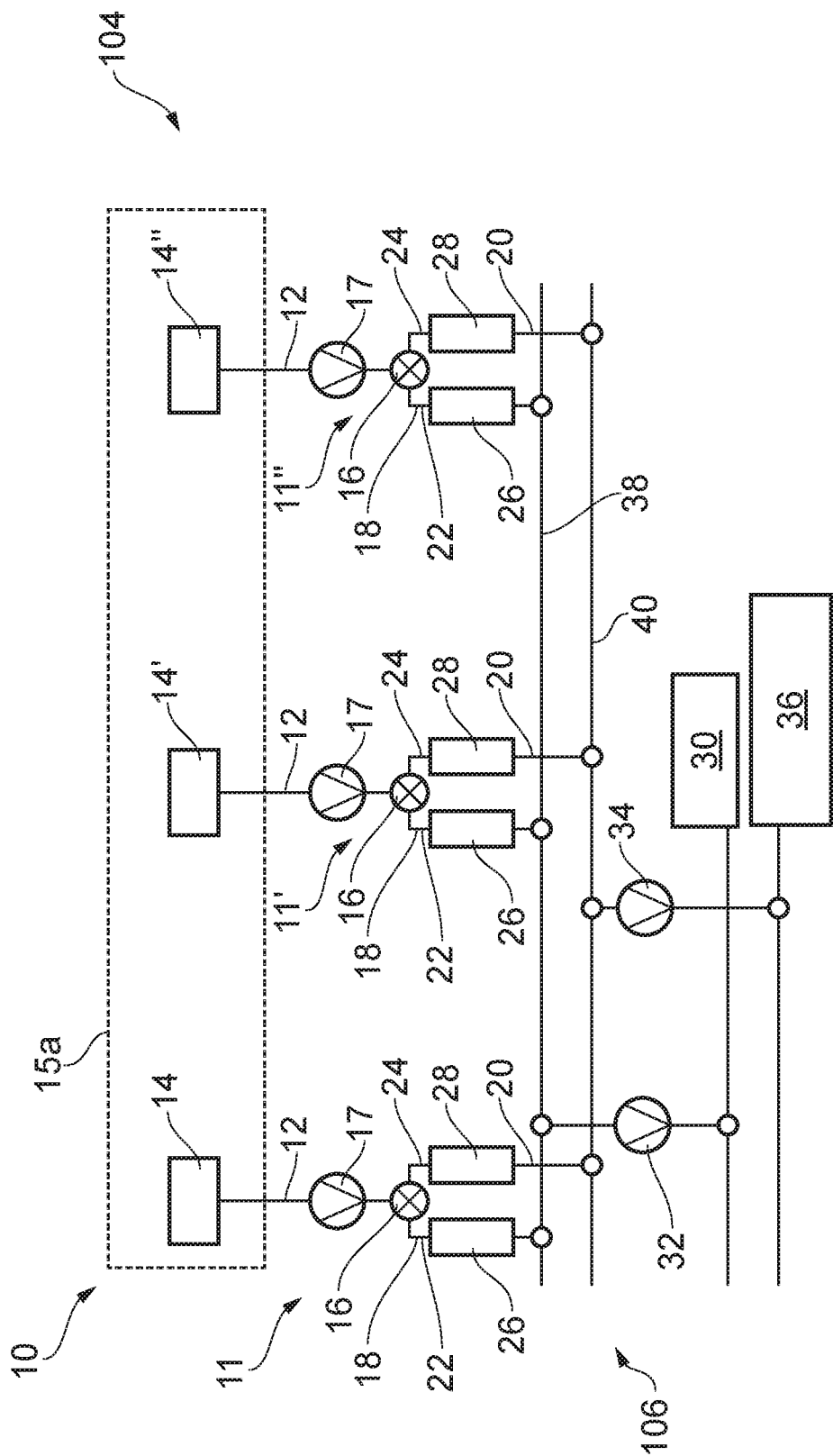
FIG. 2 shows a schematic view of a plurality of pumping line arrangements in another semiconductor fabrication assembly.

A modified semiconductor fabrication assembly 104 is shown in FIG. 2. In FIG. 2 like reference numerals have been adopted for like components.

The assembly comprises a modified fabrication tool 15a comprising a plurality of process chambers 14, 14', 14". A modified vacuum pumping system 106 comprises a plurality of pumping line arrangements 11, 11', 11" for connection to respective process chambers. The pumping line arrangements shown are similar to that shown in FIG. 1 and described above.

In the example of FIG. 2, the first and the second common pumping lines 38, 40 are connected to the plurality of pumping line arrangements. The fabrication tool or tools 15a comprises a plurality of process chambers for evacuation by the plurality of vacuum pumping arrangements 32, 34 also shown in FIG. 1. The plurality of common pumping lines 38, 40 are in fluid connection with respective associated vacuum pumping arrangements. As shown, the first common pumping line 38 is in fluid connection with vacuum pumping arrangement 32 and the second common pumping line 40 is in fluid connection with vacuum pumping arrangement 34. The first pumping lines 18 of the pumping line arrangements 11, 11', 11" are in fluid connection with the first common pumping line 38, and the second pumping lines 24 of the pumping line arrangements 11, 11', 11" are in fluid connection with the second common pumping line 40.

Therefore in normal operation first process gas flows from chambers 11, 11', 11" are conveyed by first pumping line 18, first common pumping line 38, and first vacuum pumping arrangement 32 for abatement by first primary abatement module 30, and second process gas flows from chambers 11, 11', 11" are conveyed by second pumping line 24, second common pumping line 40, and second vacuum pumping arrangement 34 for abatement by second primary abatement module 36. Therefore there is a pumping line arrangement for each chamber 11, 11', 11" and as many pumping lines (and common pumping lines) as required for each process gas flow.

In each chamber, the process steps occur sequentially (a first step followed by a second step) and therefore incompatible gases do not mix or if they mix the concentration is so low as not to cause a problem. When there are multiple chambers, a first process step using a first process gas flow may be performed in one of chambers 14, 14', 14" while a second process step using a second process gas flow in another chamber. Therefore, although a first process step is time resolved with a second process step for each chamber, first and second steps may not be time resolved across the multiple chambers as a whole. If for example a second process gas flow is inadvertently during a fault evacuated from chamber 14' along the first pumping line 18 of arrangement 11', it would (in the absence of the pre-abatement module 26) mix potentially catastrophically with a first process gas flow evacuated from chamber 14 along the first pumping line 18 of arrangement 11. The concentrations of the two incompatible gas flows in these circumstances are such that a catastrophic event is exaggerated. However, in the present arrangement, the pre-abatement module removes those constituents from the second process gas flow that are incompatible with constituents of the first process gas flow to avoid such mixing.

In the embodiments shown the first pre-abatement module 26 includes a fluorine removal agent (not shown) in the form of calcium carbonate ($CaCO_3$).

In use the calcium carbonate is warmed, e.g. to around 300° C. Thereafter, during normal operation, conventional deposition gases such as silane, ammonia or hydrogen, pass through the calcium carbonate without reaction, and so can be optimally abated downstream thereof by the first primary abatement module 30, e.g. a DC plasma device.

In contrast, during a fault operation, e.g. in which a cleaning process fluid, i.e. fluorine gas, is erroneously directed into the first pumping line 18, the calcium carbonate reacts with the fluorine by the following reaction:

$$CaCO_3 + F_2 = CaF_2 + CO_2 + O_2$$

Of the resulting by-products, neither calcium fluoride ($CaF_2$) nor carbon dioxide ($CO_2$) reacts with any of the conventional deposition gases (e.g. silane, ammonia, and hydrogen) which may be in the first process flow. Moreover, providing the concentration of hydrogen is relatively low in the first process flow, such hydrogen will not react with the resulting oxygen ($O_2$) by-product, and providing the concentration of silane in the first process flow is below it pyrophoric limit, such silane will also not react with the oxygen by-product.

Accordingly the calcium carbonate acts to neutralise the second process flow such that the resulting by-products are much less likely to react with a conventional deposition gas if encountered downstream thereof in the first pumping line 18.

In another embodiment of the invention (not shown) the fluorine removal agent may be silicon (Si) which, in use, is again warmed to around 300° C.

Similarly, during normal operation conventional deposition gases pass through the silicon without reaction, and so can be optimally abated downstream thereof by the first primary abatement module 30.

Again, during a fault operation the silicon similarly reacts with fluorine by the following reaction:

$$Si + 2F_2 = SiF_4$$

The resulting by-product, silicon tetrafluoride ($SiF_4$), does not react with any of the conventional deposition gases which may be in the first process flow and, advantageously, no oxygen is produced which means higher concentrations of hydrogen and/or silane can be included in the first process flow without the risk of an unwanted reaction occurring.

Accordingly the silicon similarly acts to neutralise the second process flow such that thereafter it is much less likely to react with a conventional deposition gas if encountered in the first pumping line 18.

Furthermore, in the embodiment shown the second pre-abatement module 28 includes a fluorinating agent (not shown) in the form of cobalt (III) fluoride ($8CoF_3$).

In use, during normal operation, a conventional cleaning gas such as fluorine passes through the cobalt (III) fluoride without reaction, and so can be optimally abated downstream thereof by the second primary abatement module 36, i.e. the wet scrubber.

In contrast, during a fault operation in which a deposition gas, e.g. silane, is erroneously directed into the second pumping line 20, the silane ($SiH_4$) is readily fluorinated according to the reaction below:

$$3SiH_4 + 8CoF_3 = 3SiF_4 + 12HF + 8Co$$

None of the resulting by-products reacts with any cleaning gas, i.e. fluorine, in the second process flow, and so the cobalt (III) fluoride acts to neutralise the second process flow such that the resulting by-products are inert relative to any such conventional cleaning gas that may be encountered thereafter in the second pumping line 20.

The metallic cobalt (Co) by-product may be re-oxidized to cobalt (III) fluoride by subsequently exposing it to fluorine flowing, as intended, in the second pumping line 20.

A suitable support for the cobalt (III) fluoride, which is unreactive towards fluorine is calcium fluoride ($CaF_2$). Granular calcium fluoride can be made conveniently, e.g. by passing a dilute stream of hydrogen fluoride (IV) in nitrogen ($N_2$) over granular lime at an elevated temperature, according to the reaction below:

$$CaO + 2HF = CaF_2 + H_2O$$

Thereafter a convenient route to cobalt (III) fluoride is described by the reaction below:

$$2CoCl_2 + 3F_2 = 2CoF_3 + 2Cl_2$$

The support could thus be coated by spraying or tumbling with, e.g. a solution of cobalt (II) chloride ($CoCl_2$) in ethanol ($C_2H_5OH$). In this regard cobalt (II) chloride is readily soluble in ethanol at a concentration of 544 g·l$^{-1}$.

The use of an ethanolic solution would allow the cobalt (II) chloride to be absorbed onto lime prior to its conversion to calcium fluoride.

Hydrogen fluoride (HF) will not react appreciably with cobalt (II) chloride in the gas phase as the reaction below:

$$CoCl_2 + 2HF = CoF_2 + 2HCl$$

However, in practice whether or not the foregoing reaction proceeds is of little consequence because both cobalt (II) chloride and cobalt (II) fluoride can be converted to cobalt (III) fluoride by heating with fluorine.

In other embodiments of the invention (not shown) the fluorinating agent may be another transitional metal fluoride, such as a ferric fluoride, or potassium tetrafluorocobaltate.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A pumping line arrangement, for use in a semiconductor fabrication assembly, comprising:
    a chamber connecting line fluidly connectable to a process chamber forming part of a semiconductor fabrication tool within which at least two process steps are performed; and
    a valve module fluidly connected to the chamber connecting line, the valve module splitting the chamber connecting line into respective first and second pumping lines, the first pumping line being intended to carry a first process step exhaust flow and the second pumping line being intended to carry a second process step exhaust flow which is incompatible with the first process step exhaust flow,
    wherein the first pumping line includes fluidly connected therewithin a first pre-abatement module configured to remove one or more incompatible process step exhaust constituents from the second process step exhaust flow, and wherein the second pumping line includes fluidly connected therewithin a second pre-abatement module configured to remove one or more incompatible process step exhaust constituents from the first process step exhaust flow, wherein the second pre-abatement module includes a fluorinating agent.

2. The pumping line arrangement according to claim 1 wherein each pre-abatement module is fluidly connected within the corresponding pumping line immediately downstream of the valve module.

3. The pumping line arrangement according to claim 1 wherein the first pumping line defines a deposition pumping line intended to carry a deposition process flow, the second pumping line defines a cleaning pumping line intended to carry a cleaning process flow, and wherein the first pre-abatement module is configured to remove one or more incompatible process step exhaust constituents from the cleaning process flow and the second pre-abatement module is configured to remove one or more incompatible process step exhaust constituents from the deposition process flow.

4. The pumping line arrangement according to claim 1 wherein the first pre-abatement module includes a fluorine removal agent.

5. The pumping line arrangement according to claim 4 wherein the fluorine removal agent comprises at least one of:
    calcium carbonate; and
    silicon.

6. The pumping line arrangement according to claim 1 wherein the fluorinating agent comprises at least one of:
    a transitional metal fluoride; and
    potassium tetrafluorocobaltate.

7. The pumping line arrangement according to claim 6 wherein the transitional metal fluoride comprises at least one of:
    cobalt (III) fluoride; and
    a ferric fluoride (iron (III) fluoride).

8. A vacuum pumping system comprising a pumping line arrangement according to claim 1 wherein the vacuum pumping system comprises a first primary abatement module and a second primary abatement module and the first pumping line is fluidly connected with the first primary abatement module which is configured to abate the first process flow, and the second pumping line is fluidly connected with the second primary abatement module which is configured to abate the second process flow, each of the primary abatement modules being located downstream of the corresponding upstream pre-abatement module.

9. The vacuum pumping system according to claim 8, further comprising:
    a plurality of pumping line arrangements, each having respective chamber connecting lines that are fluidly connectable to respective process chambers forming part of one or more semiconductor fabrication tools;
    a first common pumping line in fluid connection with the first primary abatement module and the first pumping lines of the pumping line arrangements; and
    a second common pumping line in fluid connection with the second primary abatement module and the second pumping lines of the pumping line arrangements.

10. The vacuum pumping system according to claim 9, wherein the first common pumping line is in fluid connection with a first vacuum pumping arrangement and the second common pumping line is in fluid connection with a second vacuum pumping arrangement.

* * * * *